United States Patent [19]
Herbst, II

[11] Patent Number: 5,457,342
[45] Date of Patent: Oct. 10, 1995

[54] INTEGRATED CIRCUIT COOLING APPARATUS

[76] Inventor: Gerhardt G. Herbst, II, 1161 N. Woodsmill Rd., Apt C, Chesterfield, Mo. 63017

[21] Appl. No.: 220,204

[22] Filed: Mar. 30, 1994

[51] Int. Cl.⁶ ............................ H01L 23/02; H01L 25/04
[52] U.S. Cl. .................. 257/712; 257/722; 257/930; 361/696; 361/697; 361/701
[58] Field of Search ........................ 257/712, 722, 257/930; 361/695, 696, 697, 701, 702, 703

[56] References Cited

U.S. PATENT DOCUMENTS

| | | | |
|---|---|---|---|
| 4,459,638 | 7/1984 | Brehm et al. | 257/722 |
| 4,685,081 | 8/1987 | Richman | 365/1 |
| 4,935,864 | 6/1990 | Schmidt et al. | 257/714 |
| 5,028,988 | 7/1991 | Porter et al. | 357/81 |
| 5,032,897 | 7/1991 | Mansuria et al. | 257/930 |
| 5,040,381 | 8/1991 | Hazen | 62/3.2 |
| 5,079,618 | 1/1992 | Farnworth | 357/81 |
| 5,150,198 | 9/1992 | Ohikata et al. | 357/81 |
| 5,156,004 | 10/1992 | Wu et al. | 257/714 |
| 5,309,983 | 5/1994 | Bailey | 257/722 |

FOREIGN PATENT DOCUMENTS

| | | | |
|---|---|---|---|
| 0148400 | 12/1978 | Japan | 257/930 |
| 0137239 | 8/1983 | Japan | 257/930 |

*Primary Examiner*—Rolf Hille
*Assistant Examiner*—David Ostrowski

[57] ABSTRACT

A new and improved integrated circuit cooling apparatus includes a heat-conductive base plate to be placed against an integrated circuit, a Peltier Effect cooling module having a cooling side connected to a top surface of the heat-conductive base plate, a heat radiator assembly connected to a heating side of the Peltier Effect cooling module, and a fan assembly juxtaposed next to a heat-radiating portion of the heat radiator assembly. The Peltier Effect cooling module cools the integrated circuit, and the fan assembly cools heat radiated from the heat radiator assembly. The heat radiator assembly can include threaded channels, and the fan assembly includes connection apertures adapted to be placed in registration with the threaded channels of the heat radiator assembly. Threaded connectors, such as screws, are adapted to connect to the threaded channels to connect the fan assembly to the heat radiator assembly. The Peltier Effect cooling module and the fan assembly are powered, in parallel, by a common power source such as a 12 VDC power source for a standard computer housing ventilation fan. The heat-conductive base plate, the Peltier Effect cooling module, the heat radiator assembly, and the fan assembly are fabricated as a unified retrofitting module capable of being placed on an integrated circuit. A quantity of a heat-conductive, double-sided adhesive tape material can be placed between the integrated circuit and the bottom surface of the heat-conductive base plate for securing the apparatus to the integrated circuit.

5 Claims, 4 Drawing Sheets

INTEGRATED CIRCUIT COOLING APPARATUS

BACKGROUND OF THE INVENTION

1. Field of the Invention

The present invention relates generally to cooling devices and, more particularly, to devices especially adapted for cooling integrated circuits.

2. Description of the Prior Art

When integrated circuits are in operation, they generate heat. When heat generation is relatively low, ambient air may be sufficient to cool the integrated circuits. When more heat exchange is needed than can be provided by ambient air, a fan is often employed to exchange relatively large quantities of ambient air for cooling. However, there are certain integrated circuits which generate so much heat that the use of a cooling fan may not be sufficient for cooling the integrated circuits.

Currently, a standard 486-based central processing unit (CPU) or Intel Pentium CPU may run as high as 180 degrees Fahrenheit or higher. With such hot-running integrated circuits, cooling may be a very difficult problem. Such 486-based central processing units or Intel Pentium CPU's are provided with cooling fans, but such cooling fans may not be adequate for providing proper cooling to the CPU's and adjacent components. To assure adequate cooling, it would be desirable is a positive cooling source could be provided for the 486-based central processing unit or Intel Pentium CPU.

In the art of cooling integrated circuits, it is well known to employ the electronic effect known as the Peltier Effect for providing an active cooling device. Devices which operate with the Peltier Effect actually create a cool surface. In doing so, the Peltier Effect also creates a hot surface.

Throughout the years, a number of innovations have been developed relating to cooling integrated circuits with Peltier Effect devices, and the following U.S. Pat. are representative of some of those innovations: Nos. 4,685,081; 5,028,988; 5,040,381; and 5,079,618. More specifically, U.S. Pat. No. 4,685,081 discloses a Peltier junction device that is used for thermal control of solid state devices. This Peltier junction device is electronically controlled for both cooling and heating a solid state bubble memory. For cooling 486-based central processing units or Intel Pentium CPU's there is no need for a heating capability.

U.S. Pat. No. 5,028,988 discloses cooling devices for integrated circuits that employ cryogenics and water cooling. The use of cryogenics requires expensive equipment and complex procedures. Moreover, the use of water for cooling electronic components has its own risks and dangers.

U.S. Pat. No. 5,040,381 discloses an apparatus for cooling circuit modules that includes a Peltier Effect cooling device, a heat sink placed between a circuit module and the Peltier Effect device, and a fin-containing heat radiator attached to the backside of the Peltier Effect device. The Peltier Effect device is laminated between two layers of a polymer based thermally conductive dielectric material. However, the lamination process is an expensive and time consuming process.

U.S. Pat. No. 5,079,618 discloses semiconductor device structures that are cooled by Peltier junctions and electrical interconnect assemblies. With the structures disclosed in this patent, the device that is cooled by the Peltier junction is placed on top of the Peltier junction. Such structures could not be used with 486-based central processing units or Intel Pentium CPU's which are connected to a mother board. In this respect, it would be desirable if a Peltier Effect cooling device for integrated circuits were provided that can be placed on top of an integrated circuit that is connected to a mother board.

There are many computer systems currently in use that employ 486-based central processing units or Intel Pentium CPU's. In view of the heat problems discussed above, it would be desirable if a device were provided which could readily retrofit a 486-based central processing unit (CPU) or Intel Pentium CPU with a Peltier Effect cooling device.

As mentioned above, many computer systems are provided with electrically powered ventilation fans. The power supplied to most electrically powered computer ventilation fans is generally 12 VDC. Peltier Effect devices are available that are also powered by 12 VDC. Thus, it would be desirable for a Peltier Effect cooling device to be retrofitted to a 486-based central processing unit or Intel Pentium CPU that is readily adapted to being powered by 12 VDC electrical power in a computer.

As mentioned above, a cooling device for integrated circuits that employs the Peltier Effect also generates its own inherent heat. If such a Peltier Effect cooling device were retrofitted to a computer that employs a current 486-based central processing unit or Intel Pentium CPU, then an overall added heat load would be added to the existing ventilation fan that is used for cooling the computer. Such an added heat load may exceed the capacity of the original ventilation fan. To overcome the added heat generated by the Peltier Effect cooling device and to remove heat from the 486-based central processing unit or Intel Pentium CPU, it would be desirable for a retrofitted Peltier Effect cooling device for integrated circuits to have its own dedicated ventilation fan. Moreover, it would be desirable for the dedicated cooling fan in a retrofitted cooling device to derive power for running the dedicated cooling fan from the same 12 VDC power source that powers the original ventilation fan.

For a Peltier Effect cooling device that is retrofitted to integrated circuits, the retrofitted cooling device should be an integrated retrofitting module that contains a heat sink that is placed in close proximity to the integrated circuits, that contains a Peltier Effect cooling assembly that is placed in contact with the heat sink, that contains a heat radiator that is placed in contact with the Peltier Effect cooling assembly, and that contains a dedicated ventilation fan that circulates air across the heat radiator.

U.S. Pat. No. 5,150,198 may be of interest for its disclosure of a plate-shaped heat radiator for semiconductor chips. The Peltier Effect is not employed with this device.

Thus, while the foregoing body of prior art indicates it to be well known to use Peltier Effect cooling devices for cooling integrated circuits, the prior art described above does not teach or suggest an integrated circuit cooling apparatus which has the following combination of desirable features: (1) provides a positive cooling source for a 486-based central processing unit or Intel Pentium CPU; (2) does not have a heating capability; (3) does not employ expensive equipment and complex procedures for handling cryogenics; (4) does not use water for cooling electronic components; (5) does not employ an expensive and time consuming lamination process; (6) can be placed on top of an integrated circuit that is connected to a mother board; (7) can readily retrofit a 486-based central processing unit (CPU) or an Intel Pentium CPU with a Peltier Effect cooling device; (8) is readily adapted to being powered by 12 VDC electrical power present in a computer; (9) has its own dedicated ventilation fan for overcoming the added heat generated by a Peltier Effect cooling device and for removing heat produced by a 486-based central processing unit or Intel Pentium CPU; (10) provides an element for securing a Peltier Effect cooling device to integrated circuits; (11) derives power for running a dedicated cooling fan from the same 12 VDC power source that powers the original ventilation fan; and (12) is an integrated retrofitting module that contains a heat sink that is placed in close proximity to integrated circuits, that contains a Peltier Effect cooling assembly that is placed in contact with the heat sink, that contains a heat radiator that is placed in contact with the Peltier Effect cooling assembly, and that contains a dedicated ventilation fan that circulates air across the heat radiator. The foregoing desired characteristics are provided by the unique integrated circuit cooling apparatus of the present invention as will be made apparent from the following description thereof. Other advantages of the present invention over the prior art also will be rendered evident.

SUMMARY OF THE INVENTION

To achieve the foregoing and other advantages, the present invention, briefly described, provides a new and improved integrated circuit cooling apparatus which includes a heat-conductive base plate which includes a top surface and a bottom surface adapted to be placed in close proximity to an integrated circuit. A Peltier Effect cooling module is provided which includes a cooling surface and a heating surface. The cooling surface of the Peltier Effect cooling module is connected to the top surface of the heat-conductive base plate. A heat radiator assembly is provided which includes a heat-receiving portion and a heat-radiating portion, wherein the heat-receiving portion is connected to the heating surface of the Peltier Effect cooling module. A fan assembly is juxtaposed next to the heat-radiating portion of the heat radiator assembly and circulates air next to the heat-radiating portion of the heat radiator assembly for cooling the heat-radiating portion.

The heat radiator assembly can include threaded channels, and the fan assembly includes connection apertures adapted to be placed in registration with the threaded channels of the heat radiator assembly. Threaded connectors, such as screws, are adapted to connect to the threaded channels. Thereby, the threaded connectors connect the fan assembly to the heat radiator assembly when the connection apertures are placed in registration with the threaded channels and the threaded connectors are connected to the threaded channels.

The Peltier Effect cooling module and the fan assembly are powered by a common power source in parallel. The fan assembly includes a first conductor assembly. The Peltier Effect cooling module includes a second conductor assembly. The first conductor assembly and the second conductor assembly are connected in parallel to a third conductor assembly and a common electrical connector assembly. The common power source is a 12 VDC power source. The 12 VDC power source is a source of power of a computer housing ventilation fan.

The heat-conductive base plate, the Peltier Effect cooling module, the heat radiator assembly, and the fan assembly are fabricated as a unified retrofitting module capable of being placed on an integrated circuit, such as a 486-based central processing unit or Intel Pentium CPU. A quantity of a heat-conductive adhesive material can be placed between the integrated circuit and the bottom surface of the heat-conductive base plate for securing the apparatus to the integrated circuit. The heat-conductive adhesive material can be a double-sided adhesive tape.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will be for the subject matter of the claims appended hereto.

In this respect, before explaining a preferred embodiment of the invention in detail, it is understood that the invention is not limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

It is therefore an object of the present invention to provide a new and improved integrated circuit cooling apparatus which has all of the advantages of the prior art and none of the disadvantages.

It is another object of the present invention to provide a new and improved integrated circuit cooling apparatus which may be easily and efficiently manufactured and marketed.

It is a further object of the present invention to provide a new and improved integrated circuit cooling apparatus which is of durable and reliable construction.

An even further object of the present invention is to provide a new and improved integrated circuit cooling apparatus which is susceptible of a low cost of manufacture with regard to both materials and labor, and which accordingly is then susceptible of low prices of sale to the consuming public, thereby making such integrated circuit cooling apparatus available to the buying public.

Still yet a further object of the present invention is to provide a new and improved integrated circuit cooling apparatus which provides a positive cooling source for a 486-based central processing unit or Intel Pentium CPU.

Still another object of the present invention is to provide a new and improved integrated circuit cooling apparatus that does not have a heating capability.

Yet another object of the present invention is to provide a new and improved integrated circuit cooling apparatus which does not employ expensive equipment and complex procedures for handling cryogenics.

Even another object of the present invention is to provide a new and improved integrated circuit cooling apparatus that does not use water for cooling electronic components.

Still a further object of the present invention is to provide a new and improved integrated circuit cooling apparatus which does not employ an expensive and time consuming lamination process.

Yet another object of the present invention is to provide a new and improved integrated circuit cooling apparatus that can be placed on top of an integrated circuit that is connected to a mother board.

Still another object of the present invention is to provide a new and improved integrated circuit cooling apparatus which can readily retrofit a 486-based central processing unit (CPU) or an Intel Pentium CPU with a Peltier Effect cooling device.

Yet another object of the present invention is to provide a new and improved integrated circuit cooling apparatus that is readily adapted to being powered by 12 VDC electrical power present in a computer.

Still a further object of the present invention is to provide a new and improved integrated circuit cooling apparatus that has its own dedicated ventilation fan for overcoming the added heat generated by a Peltier Effect cooling device and for removing heat produced by a 486-based central processing unit or Intel Pentium CPU.

Yet another object of the present invention is to provide a new and improved integrated circuit cooling apparatus which provides an element for securing a Peltier Effect cooling device to integrated circuits.

Still a further object of the present invention is to provide a new and improved integrated circuit cooling apparatus that derives power for running a dedicated cooling fan from the same 12 VDC power source that powers the original ventilation fan.

Yet another object of the present invention is to provide a new and improved integrated circuit cooling apparatus which is an integrated retrofitting module that contains a heat sink that is placed in close proximity to integrated circuits, that contains a Peltier Effect cooling assembly that is placed in contact with the heat sink, that contains a heat radiator that is placed in contact with the Peltier Effect cooling assembly, and that contains a dedicated ventilation fan that circulates air across the heat radiator.

These together with still other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

BRIEF DESCRIPTION OF THE DRAWINGS

The invention will be better understood and the above objects as well as objects other than those set forth above will become more apparent after a study of the following detailed description thereof. Such description makes reference to the annexed drawing wherein.

DESCRIPTION OF THE PREFERRED EMBODIMENT

With reference to the drawings, a new and improved integrated circuit cooling apparatus embodying the principles and concepts of the present invention will be described.

Figure 1:
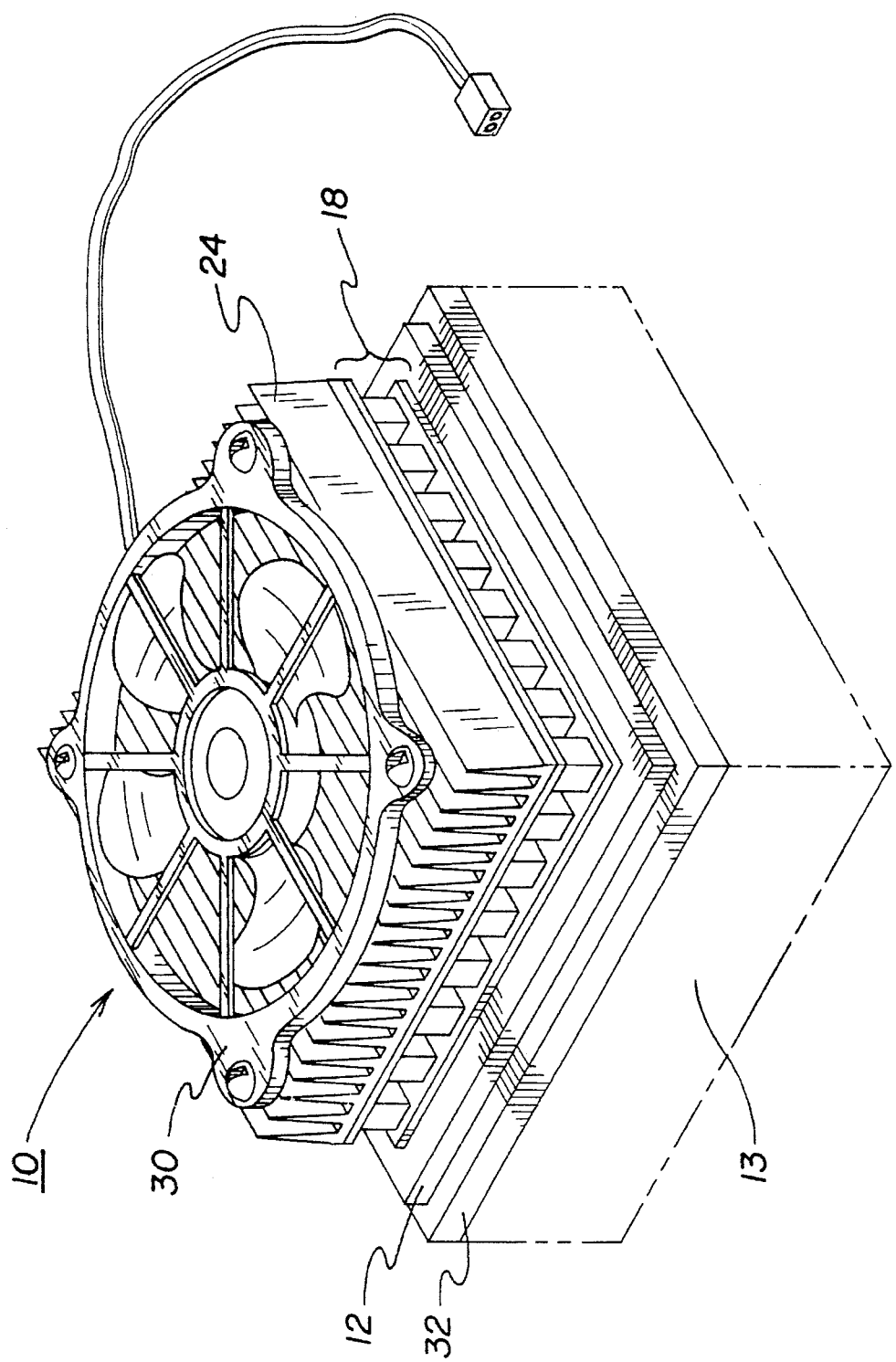
FIG. 1 is a perspective view showing a preferred embodiment of the integrated circuit cooling apparatus of the invention secured to an integrated circuit CPU.
Figure 2:
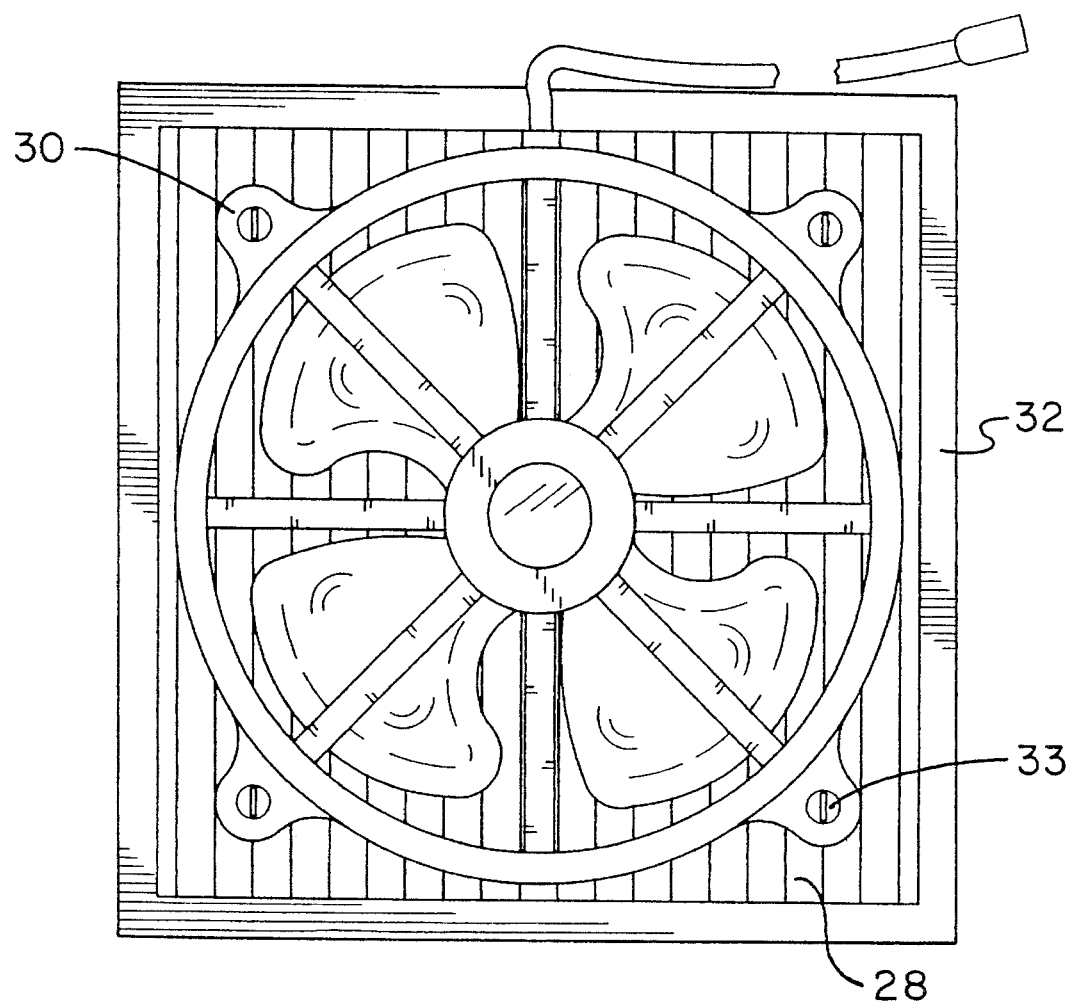
FIG. 2 is an enlarged top view of the embodiment of the integrated circuit cooling apparatus shown in FIG. 1.
Figure 3:
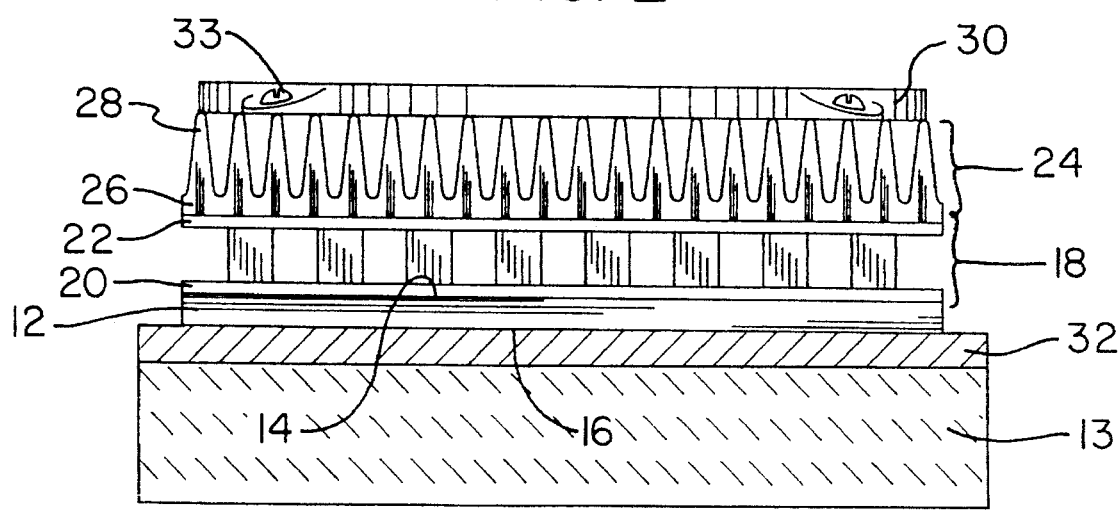
FIG. 3 is a side view of the embodiment of the integrated circuit cooling apparatus of FIG. 2.
Figure 4:
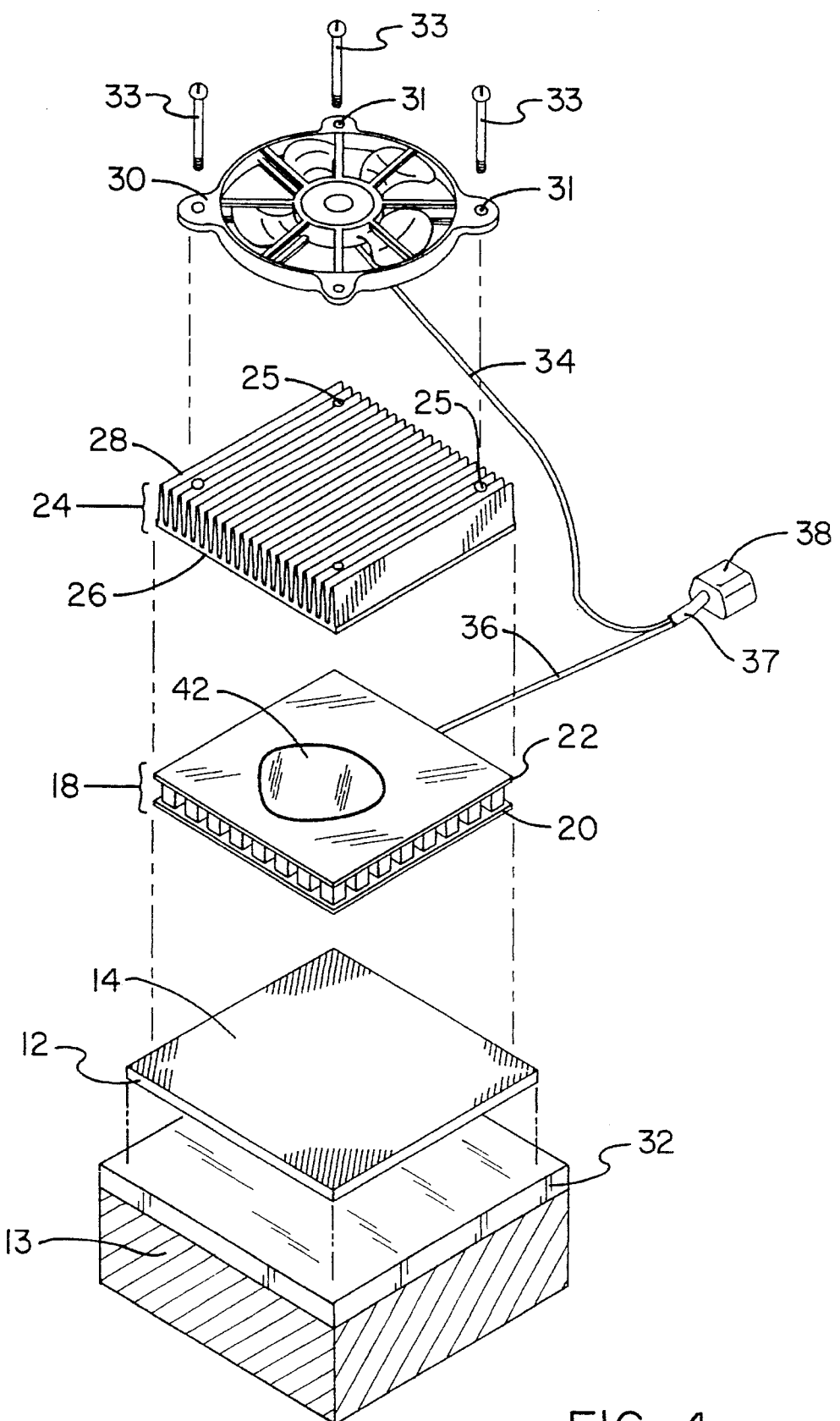
FIG. 4 is an exploded perspective view of the embodiment of the invention shown in FIG. 3.
Figure 5:
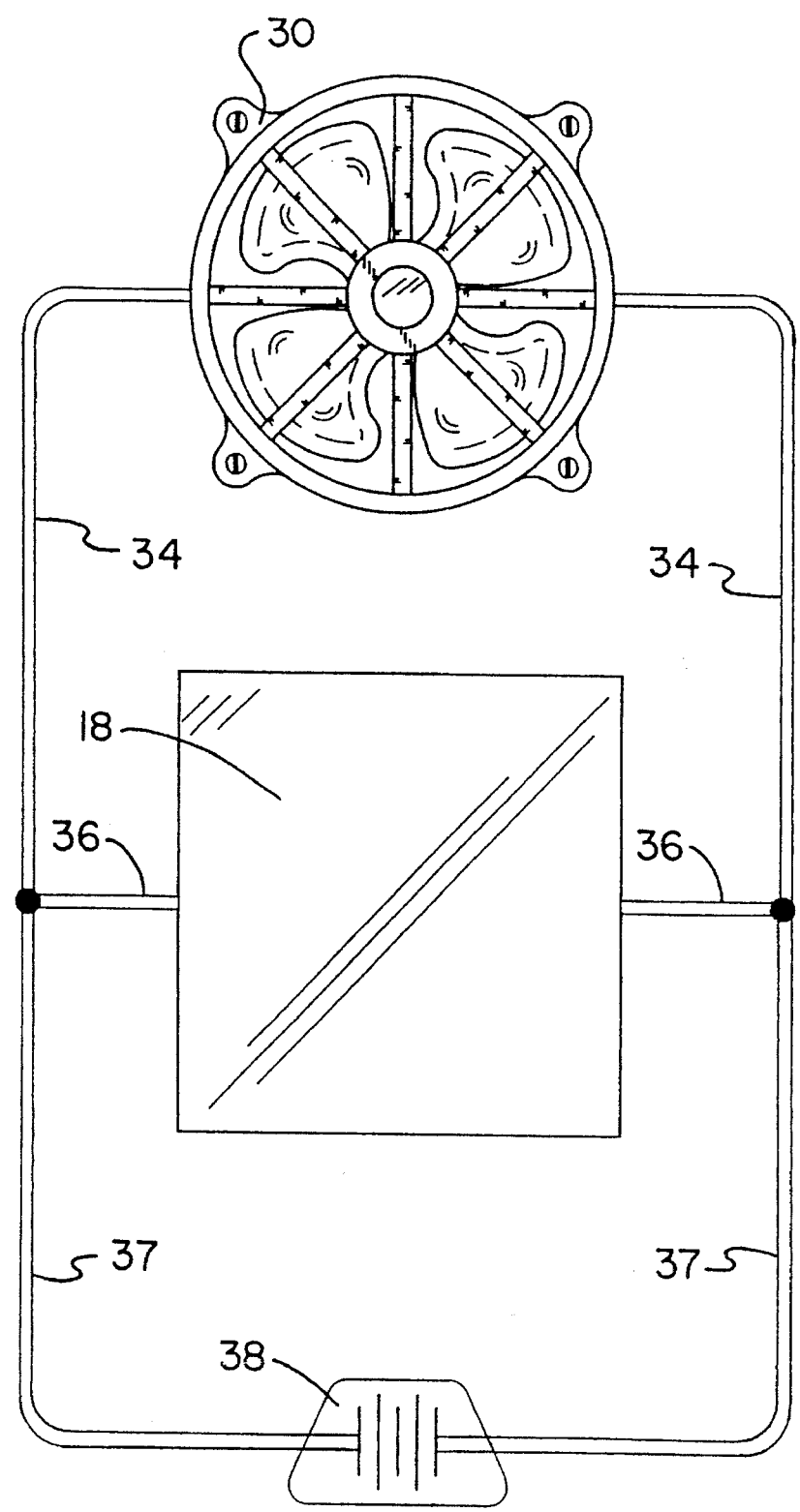
FIG. 5 is a schematic diagram of an electrical circuit used for powering the embodiment of the integrated circuit cooling apparatus of the invention shown in FIGS. 1–4.

Turning to FIGS. 1–5, there is shown an exemplary embodiment of the integrated circuit cooling apparatus of the invention generally designated by reference numeral 10. In its preferred form, integrated circuit cooling apparatus 10 includes a heat-conductive base plate 12 which includes a top surface 14 and a bottom surface 16 adapted to be placed in close proximity to an integrated circuit 13. A Peltier Effect cooling module 18 is provided which includes a cooling surface 20 and a heating surface 22. The cooling surface 20 of the Peltier Effect cooling module 18 is connected to the top surface 14 of the heat-conductive base plate 12. A heat radiator assembly 24 is provided which includes a heat-receiving portion 26 and a heat-radiating portion 28, wherein the heat-receiving portion 26 is connected to the heating surface 22 of the Peltier Effect cooling module 18. A fan assembly 30 is juxtaposed next to the heat-radiating portion 28 of the heat radiator assembly 24 and circulates air next to the heat-radiating portion 28 of the heat radiator assembly 24 for cooling the heat-radiating portion 28. The heat-conductive base plate 12 is made from aluminum.

The fan assembly 30 removes heat from the heat radiator assembly 24. The heat from the heat radiator assembly 24 comes from both the integrated circuit 13 and the Peltier Effect cooling module 18. By using an embodiment of the invention, a 486-based central processing unit which can operate at a temperature as high as 180 degrees Fahrenheit can operate at a much cooler and more desirable 75 degrees Fahrenheit.

The heat radiator assembly 24 includes threaded channels 25, and the fan assembly 30 includes connection apertures 31 adapted to be placed in registration with the threaded channels 25 of the heat radiator assembly 24. Threaded connectors 33, such as screws, are adapted to connect to the threaded channels 25. Thereby, the threaded connectors 33 connect the fan assembly 30 to the heat radiator assembly 24 when the connection apertures 31 are placed in registration with the threaded channels 25 and the threaded connectors 33 are connected to the threaded channels 25. The Peltier Effect cooling module 18 and the fan assembly 30 are powered by a common power source in parallel.

The fan assembly 30 includes a first conductor assembly 34. The Peltier Effect cooling module 18 includes a second conductor assembly 36. The first conductor assembly 34 and the second conductor assembly 36 are connected in parallel to a third conductor assembly 37 and a common electrical connector assembly 38. The common power source is a 12 VDC power source. The 12 VDC power source is a source of power of a computer housing ventilation fan (not shown).

The heat-conductive base plate 12, the Peltier Effect cooling module 18, the heat radiator assembly 24, and the fan assembly 30 are fabricated as a unified retrofitting module capable of being placed on an integrated circuit 13, such as a 486-based central processing unit or Intel Pentium CPU. A quantity of a heat-conductive adhesive material 32 can be placed between the integrated circuit 13 and the bottom surface 16 of the heat-conductive base plate 12 for securing the apparatus to the integrated circuit 13. The heat-conductive adhesive material 32 can be a double-sided adhesive tape.

The principles for selection of a Peltier Effect cooling module 18 are well known as taught in the appropriate literature and in above-cited U.S. Pat. Nos. 4,685,081, 5,028,988, 5,040,381, and 5,079,618 which are incorporated herein by reference.

In fabricating a unified retrofitting module capable of being placed on an integrated circuit 13, the fan assembly 30 and the heat radiator assembly 24 are first connected together with threaded connectors 33. Then, the combined fan assembly 30/heat radiator assembly 24 is bonded to the Peltier Effect cooling module 18 with a quantity of an adhesive, e.g. epoxy adhesive 42. The first conductor assembly 34 of the fan assembly 30 and the second conductor assembly 36 of the Peltier Effect cooling module 18 are connected together electrically in parallel by the third conductor assembly 37 and the common electrical connector assembly 38. The common electrical connector assembly 38 is adapted to plug into a 12 VDC power supply generally available inside a computer case. Then, the combined fan assembly 30/heat radiator assembly 24/Peltier Effect cooling module 18 is bonded to the heat-conductive base plate 12 by another quantity of epoxy adhesive to form a unified retrofitting module that can be readily placed upon an integrated circuit 13, such as a 486-based CPU or Intel Pentium CPU.

If desired, the integrated circuit cooling apparatus 10 of the invention can be adhered to the outside case of a computer without contacting an integrated circuit 13 directly. This would provide a readily installed auxiliary cooling device for a computer. Such an auxiliary cooling device could have its own dedicated power supply.

As to the manner of usage and operation of the instant invention, the same is apparent from the above disclosure, and accordingly, no further discussion relative to the manner of usage and operation need be provided.

It is apparent from the above that the present invention accomplishes all of the objects set forth by providing a new and improved integrated circuit cooling apparatus that is low in cost, relatively simple in design and operation, and which may advantageously be used to provide a positive cooling source for a 486-based central processing unit or Intel Pentium CPU. With the invention, an integrated circuit cooling apparatus is provided which does not have a heating capability. With the invention, an integrated circuit cooling apparatus is provided which does not employ expensive equipment and complex procedures for handling cryogenics. With the invention, an integrated circuit cooling apparatus is provided which does not use water for cooling electronic components. With the invention, an integrated circuit cooling apparatus is provided which does not employ an expensive and time consuming lamination process.

With the invention, an integrated circuit cooling apparatus is provided which can be placed on top of an integrated circuit that is connected to a mother board. With the invention, an integrated circuit cooling apparatus is provided which can readily retrofit a 486-based central processing unit. With the invention, an integrated circuit cooling apparatus is provided which can retrofit a 486-based CPU or an Intel Pentium CPU with a Peltier Effect cooling device. With the invention, an integrated circuit cooling apparatus is provided which is readily adapted to being powered by 12 VDC electrical power present in a computer. With the invention, an integrated circuit cooling apparatus is provided which has its own dedicated ventilation fan for overcoming the added heat generated by a Peltier Effect cooling device and for removing heat produced by a 486-based central processing unit or Intel Pentium CPU.

With the invention, an integrated circuit cooling apparatus provides an element for securing a Peltier Effect cooling device to integrated circuits. With the invention, an integrated circuit cooling apparatus is provided which derives power for running a dedicated cooling fan from the same 12 VDC power source that powers the original ventilation fan. With the invention, an integrated circuit cooling apparatus is provided which is an integrated retrofitting module that contains a heat sink that is placed in close proximity to integrated circuits, that contains a Peltier Effect cooling assembly that is placed in contact with the heat sink, that contains a heat radiator that is placed in contact with the Peltier Effect cooling assembly, and that contains a dedicated ventilation fan that circulates air across the heat radiator.

With respect to the above description, it should be realized that the optimum dimensional relationships for the parts of the invention, to include variations in size, form function and manner of operation, assembly and use, are deemed readily apparent and obvious to those skilled in the art, and therefore, all relationships equivalent to those illustrated in the drawings and described in the specification are intended to be encompassed only by the scope of appended claims.

While the present invention has been shown in the drawings and fully described above with particularity and detail in connection with what is presently deemed to be the most practical and preferred embodiments of the invention, it will be apparent to those of ordinary skill in the art that many modifications thereof may be made without departing from the principles and concepts set forth herein. Hence, the proper scope of the present invention should be determined only by the broadest interpretation of the appended claims so as to encompass all such modifications and equivalents.

What is claimed as being and desired to be protected by LETTERS PATENT of the U.S. is as follows:

1. A new and improved integrated circuit cooling apparatus, comprising:

a heat-conductive base plate which includes a top surface and a bottom surface, wherein said bottom surface is adapted to be placed adjacent to an integrated circuit, a Peltier Effect cooling module which includes a cooling surface and a heating surface, wherein said cooling surface of said Peltier Effect cooling module is connected to said top surface of said heat-conductive base plate, a heat radiator assembly which includes a heat-receiving portion and a heat-radiating portion, wherein said heat-receiving portion of said heat radiator assembly is connected to said heating surface of said Peltier Effect cooling module, and a fan assembly, juxtaposed next to said heat-radiating portion of said heat radiator assembly, said fan assembly for circulating air next to said heat-radiating portion of said heat radiator assembly for cooling said heat-radiating portion, wherein said heat radiator assembly includes threaded channels, wherein said fan assembly includes connection apertures adapted to be placed in registration with said threaded channels of said heat radiator assembly, wherein said fan assembly includes a first electrical conductor assembly, wherein said Peltier Effect cooling module includes a second electrical conductor assembly, and wherein said first electrical conductor assembly and said second electrical conductor assembly are connected in parallel to a third electrical conductor assembly and a common electrical connector assembly for bringing electrical power to said fax assembly and said Peltier Effect cooling module, threaded connectors adapted to connect to said threaded channels such that said threaded connectors connect said fan assembly to said heat radiator assembly when said connection apertures are placed in registration with said threaded channels and said threaded connectors are connected to said threaded channels, and a sufficient quantity of a heat-conductive adhesive material adapted to be placed between the integrated circuit and said bottom surface of said heat-conductive base plate such that said heat-conductive adhesive material secures said apparatus to the integrated circuit.

2. The apparatus described in claim 1 wherein said heat-conductive base plate is made from aluminum.

3. The apparatus described in claim 1 wherein:
said Peltier Effect cooling module and said fan assembly are powered by a common power source in parallel.

4. The apparatus described in claim 1 wherein said heat-conductive base plate, said Peltier Effect cooling module, said heat radiator assembly, and said fan assembly are fabricated as a unified module capable of being placed on an integrated circuit.

5. The apparatus described in claim 1 wherein said heat-conductive adhesive material is a double-sided adhesive tape.

* * * * *